(12) United States Patent
Ahn et al.

(10) Patent No.: US 7,091,611 B2
(45) Date of Patent: Aug. 15, 2006

(54) MULTILEVEL COPPER INTERCONNECTS WITH LOW-K DIELECTRICS AND AIR GAPS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/093,244

(22) Filed: Mar. 6, 2002

(65) Prior Publication Data

US 2002/0098677 A1 Jul. 25, 2002

Related U.S. Application Data

(62) Division of application No. 09/583,514, filed on May 31, 2001, now Pat. No. 6,423,629.

(51) Int. Cl.
*H01L 23/48* (2006.01)

(52) U.S. Cl. .................. 257/758; 257/759; 257/760; 438/421; 438/422; 438/619; 438/622; 438/623; 438/624

(58) Field of Classification Search ......... 257/758–760, 257/522, 776, 276, 410; 438/618–619, 622–624, 438/421–422, 626, 631, 633, 675, 680, 702, 438/686, 629, 411
See application file for complete search history.

(56) References Cited

U.S. PATENT DOCUMENTS

| 3,337,334 A | 8/1967 | Fenn et al. ................ 75/150 |
| 3,548,915 A | 12/1970 | Richmond et al. ........... 164/68 |

(Continued)

FOREIGN PATENT DOCUMENTS

JP   5-267643   10/1993

OTHER PUBLICATIONS

Chang, J. Y. C., et al., "Large Suspended Inductors on Silicon and their use in a 2–μm CMOS RF Amplifier", *IEEE Electron Device Letters*, vol. 14, No. 5, (May/1993), 246–248.

Fleming, J.G., et al., "Use of Air Gap Structures To Lower Level Intralevel Capacitance", *Proceedings of the 1997 Dielectrics for ULSI Multi–level Interconnect Conference*, p. 140, (1997).

Grill, A., et al., "Low dielectric constant films prepared by plasma–enhanced chemical vapor deposition from tetramethvisilane", *Journal of Applied Physics*, 85 (6), pp. 3314–3318, (1999).

(Continued)

*Primary Examiner*—Andy Huynh
(74) *Attorney, Agent, or Firm*—Schwegman, Lundberg, Woessner & Kluth, P.A.

(57) ABSTRACT

Structures and methods are provided for an improved multilevel wiring interconnect in an integrated circuit assembly. The present invention provides for a multilayer copper wiring structure by electroless, selectively deposited copper in a streamlined process which further reduces both intralevel line to line capacitance and the inter-level capacitance.

In particular, an illustrative embodiment of the present invention includes a novel methodology for forming multilevel wiring interconnects in an integrated circuit assembly. The method includes forming a number of multilayer metal lines, e.g. copper lines formed by selective electroless plating, separated by air gaps above a substrate. A low dielectric constant material is deposited between the number of metal lines and the substrate using a directional process. According to the teachings of the present invention, using a directional process includes maintaining a number of air gaps in the low dielectric constant material. Structures and systems are similarly included in the present invention.

27 Claims, 5 Drawing Sheets

U.S. PATENT DOCUMENTS

| | | | |
|---|---|---|---|
| 3,832,456 A | 8/1974 | Kobetz et al. ............... 423/645 |
| 3,923,500 A | 12/1975 | Kitazawa et al. ........... 75/156.5 |
| 3,932,226 A | 1/1976 | Klatskin et al. ............... 204/16 |
| 3,954,570 A | 5/1976 | Shirk et al. .................... 204/15 |
| 4,022,931 A | 5/1977 | Black et al. .................... 427/91 |
| 4,029,377 A | 6/1977 | Guglielmi .................... 339/19 |
| 4,065,330 A | 12/1977 | Masumoto et al. ....... 148/31.55 |
| 4,101,855 A | 7/1978 | Drapeau ..................... 335/106 |
| 4,158,719 A | 6/1979 | Frantz ......................... 428/567 |
| 4,233,066 A | 11/1980 | Sundin et al. ................. 75/142 |
| 4,314,594 A | 2/1982 | Pfeifer et al. ................ 148/108 |
| 4,386,116 A | 5/1983 | Nair et al. ..................... 427/99 |
| 4,389,429 A | 6/1983 | Soclof ......................... 438/492 |
| 4,394,223 A | 7/1983 | Hall .............................. 204/15 |
| 4,423,547 A | 1/1984 | Farrar et al. .................. 29/571 |
| 4,565,157 A | 1/1986 | Brors et al. .................. 118/719 |
| 4,574,095 A | 3/1986 | Baum et al. ................ 427/53.1 |
| 4,591,173 A | 5/1986 | Marier ......................... 438/619 |
| 4,670,297 A | 6/1987 | Lee et al. ...................... 427/91 |
| 4,709,359 A | 11/1987 | Loftin ......................... 367/155 |
| 4,762,728 A | 8/1988 | Keyser et al. ................. 427/38 |
| 4,788,082 A | 11/1988 | Schmitt .................... 427/248.1 |
| 4,847,111 A | 7/1989 | Chow et al. ................... 427/38 |
| 4,857,481 A | 8/1989 | Tam et al. ................... 437/182 |
| 4,931,410 A | 6/1990 | Tokunaga et al. ........... 437/189 |
| 4,948,459 A | 8/1990 | van Laarhoven et al. ... 156/643 |
| 4,962,058 A | 10/1990 | Cronin et al. ................ 437/187 |
| 4,996,584 A | 2/1991 | Young et al. .................. 357/71 |
| 5,019,531 A | 5/1991 | Awaya et al. ................ 437/180 |
| 5,034,799 A | 7/1991 | Tomita et al. ................. 357/71 |
| 5,045,635 A | 9/1991 | Kaplo et al. ............ 174/35 GC |
| 5,084,412 A | 1/1992 | Nakasaki .................... 437/189 |
| 5,100,499 A | 3/1992 | Douglas ...................... 156/635 |
| 5,130,274 A | 7/1992 | Harper et al. ................ 437/195 |
| 5,148,260 A | 9/1992 | Inoue et al. ................... 357/67 |
| 5,149,615 A | 9/1992 | Chakravorty et al. ........ 430/313 |
| 5,158,986 A | 10/1992 | Cha et al. .................... 521/82 |
| 5,173,442 A | 12/1992 | Carey ......................... 437/173 |
| 5,227,658 A | 7/1993 | Beyer et al. ................. 257/522 |
| 5,231,036 A | 7/1993 | Miyauchi et al. |
| 5,231,056 A | 7/1993 | Sandhu ....................... 437/200 |
| 5,232,866 A | 8/1993 | Beyer et al. ................... 437/62 |
| 5,240,878 A | 8/1993 | Fitzsimmons et al. ...... 437/187 |
| 5,243,222 A | 9/1993 | Harper et al. ................ 257/774 |
| 5,256,205 A | 10/1993 | Schmitt, III et al. ........ 118/723 |
| 5,268,315 A | 12/1993 | Prasad et al. ................. 437/31 |
| 5,308,440 A | 5/1994 | Chino et al. ................. 156/664 |
| 5,324,683 A | 6/1994 | Fitch et al. .................... 437/65 |
| 5,324,684 A | 6/1994 | Kermani et al. ............... 437/95 |
| 5,334,356 A | 8/1994 | Baldwin et al. ............. 422/133 |
| 5,336,914 A | 8/1994 | Andoh ........................ 257/368 |
| 5,354,712 A | 10/1994 | Ho et al. ..................... 437/195 |
| 5,356,672 A | 10/1994 | Schmitt, III et al. ........ 127/446 |
| 5,371,042 A | 12/1994 | Ong ............................ 437/194 |
| 5,384,284 A | 1/1995 | Doan et al. .................. 437/190 |
| 5,399,897 A | 3/1995 | Cunningham et al. ...... 257/467 |
| 5,408,742 A | 4/1995 | Zaidel et al. .................. 29/846 |
| 5,413,687 A | 5/1995 | Barton et al. ........... 204/192.14 |
| 5,413,962 A | 5/1995 | Lur et al. ..................... 437/195 |
| 5,424,030 A | 6/1995 | Takahashi ................... 420/473 |
| 5,426,330 A | 6/1995 | Joshi et al. .................. 257/752 |
| 5,442,237 A * | 8/1995 | Hughes et al. .............. 257/759 |
| 5,444,015 A | 8/1995 | Aitken et al. ................ 437/182 |
| 5,447,887 A | 9/1995 | Filipiak et al. .............. 437/200 |
| 5,457,344 A | 10/1995 | Bartelink .................... 257/737 |
| 5,470,789 A | 11/1995 | Misawa ....................... 437/190 |
| 5,470,801 A | 11/1995 | Kapoor et al. ............... 437/238 |
| 5,476,817 A | 12/1995 | Numata ....................... 437/195 |
| 5,485,037 A | 1/1996 | Marrs .......................... 257/712 |
| 5,495,667 A | 3/1996 | Farnworth et al. ............ 29/843 |
| 5,506,449 A | 4/1996 | Nakano et al. .............. 257/758 |
| 5,510,645 A | 4/1996 | Fitch et al. .................. 257/522 |
| 5,529,956 A | 6/1996 | Morishita ................... 437/195 |
| 5,534,731 A * | 7/1996 | Cheung ...................... 257/759 |
| 5,538,922 A | 7/1996 | Cooper et al. ............... 437/195 |
| 5,539,060 A | 7/1996 | Tsunogae et al. ............ 525/338 |
| 5,539,227 A | 7/1996 | Nakano ....................... 257/276 |
| 5,578,146 A | 11/1996 | Grant et al. ................. 148/437 |
| 5,595,937 A | 1/1997 | Mikagi ........................ 437/192 |
| 5,609,721 A | 3/1997 | Tsukune et al. .......... 156/646.1 |
| 5,625,232 A | 4/1997 | Numata et al. .............. 257/758 |
| 5,635,253 A | 6/1997 | Canaperi et al. ............ 427/437 |
| 5,654,245 A | 8/1997 | Allen .......................... 438/629 |
| 5,662,788 A | 9/1997 | Sandhu et al. ................. 205/87 |
| 5,667,600 A | 9/1997 | Grensing et al. ............ 148/437 |
| 5,668,398 A * | 9/1997 | Havemann et al. ......... 257/522 |
| 5,670,420 A | 9/1997 | Choi ........................... 437/189 |
| 5,674,787 A | 10/1997 | Zhao et al. .................. 437/230 |
| 5,675,187 A | 10/1997 | Numata et al. .............. 257/758 |
| 5,679,608 A | 10/1997 | Cheung et al. .............. 437/195 |
| 5,681,441 A | 10/1997 | Svendsen et al. ........... 205/114 |
| 5,695,810 A | 12/1997 | Dubin et al. ................... 427/96 |
| 5,705,425 A | 1/1998 | Miura et al. ................. 437/182 |
| 5,719,089 A | 2/1998 | Cherng et al. ............... 438/637 |
| 5,719,410 A | 2/1998 | Suehiro et al. ................ 257/77 |
| 5,725,689 A | 3/1998 | Nishida et al. .............. 148/320 |
| 5,739,579 A | 4/1998 | Chiang et al. ............... 257/635 |
| 5,759,906 A * | 6/1998 | Lou ............................ 438/623 |
| 5,763,953 A | 6/1998 | Iljima et al. ................. 257/762 |
| 5,780,358 A | 7/1998 | Zhou et al. .................. 438/645 |
| 5,785,570 A | 7/1998 | Bruni ............................ 445/52 |
| 5,792,522 A | 8/1998 | Jin et al. ...................... 427/575 |
| 5,792,706 A | 8/1998 | Michael et al. .............. 438/626 |
| 5,801,098 A | 9/1998 | Fiordalice et al. ........... 438/653 |
| 5,814,557 A | 9/1998 | Venkatraman et al. ....... 438/622 |
| 5,821,168 A | 10/1998 | Jain ............................. 438/692 |
| 5,824,599 A | 10/1998 | Schacham-Diamand et al. ........................... 438/678 |
| 5,852,871 A | 12/1998 | Khandros ..................... 29/843 |
| 5,858,877 A | 1/1999 | Dennison et al. ........... 438/700 |
| 5,880,018 A * | 3/1999 | Boeck et al. ................ 438/619 |
| 5,891,797 A | 4/1999 | Farrar ......................... 438/619 |
| 5,891,804 A | 4/1999 | Havemann et al. ......... 438/674 |
| 5,893,752 A | 4/1999 | Zhang et al. ................ 438/687 |
| 5,895,740 A | 4/1999 | Chien et al. ................. 430/313 |
| 5,897,370 A | 4/1999 | Joshi et al. .................. 438/632 |
| 5,900,668 A * | 5/1999 | Wollesen .................... 257/522 |
| 5,907,772 A | 5/1999 | Iwasaki ....................... 438/253 |
| 5,911,113 A | 6/1999 | Yao et al. .................... 438/649 |
| 5,913,147 A | 6/1999 | Dubin et al. ................. 438/687 |
| 5,925,930 A | 7/1999 | Farnworth et al. .......... 257/737 |
| 5,930,596 A | 7/1999 | Klose et al. .................. 438/98 |
| 5,930,669 A | 7/1999 | Uzoh ........................... 438/627 |
| 5,932,928 A | 8/1999 | Clampitt ..................... 257/758 |
| 5,933,758 A | 8/1999 | Jain ............................. 438/687 |
| 5,940,733 A | 8/1999 | Beinglass et al. ........... 438/655 |
| 5,948,467 A | 9/1999 | Nguyen et al. ............... 427/99 |
| 5,953,626 A | 9/1999 | Hause et al. |
| 5,962,923 A | 10/1999 | Xu et al. ..................... 257/774 |
| 5,968,333 A | 10/1999 | Nogami et al. ............. 205/184 |
| 5,969,422 A | 10/1999 | Ting et al. ................... 257/762 |
| 5,972,179 A | 10/1999 | Chittipeddi et al. ... 204/192.17 |
| 5,972,804 A | 10/1999 | Tobin et al. ................. 438/786 |
| 5,976,710 A | 11/1999 | Sachdev et al. ............. 428/620 |
| 5,981,350 A | 11/1999 | Geusic et al. ............... 438/386 |
| 5,985,759 A | 11/1999 | Kim et al. ................... 438/653 |
| 5,989,623 A | 11/1999 | Chen et al. ................... 427/97 |
| 5,994,776 A * | 11/1999 | Fang et al. .................. 257/758 |
| 5,994,777 A | 11/1999 | Farrar ......................... 257/758 |
| 6,001,730 A | 12/1999 | Farkas et al. ................ 438/627 |
| 6,008,117 A | 12/1999 | Hong et al. .................. 438/629 |

| | | | |
|---|---|---|---|
| 6,015,465 A | | 1/2000 | Kholodenko et al. ........ 118/719 |
| 6,015,738 A | | 1/2000 | Levy et al. .................. 438/275 |
| 6,017,820 A | | 1/2000 | Ting et al. ................... 438/689 |
| 6,022,802 A | * | 2/2000 | Jang ............................. 438/656 |
| 6,025,261 A | | 2/2000 | Farrar et al. ................. 438/619 |
| 6,030,877 A | | 2/2000 | Lee et al. .................... 438/381 |
| 6,037,248 A | * | 3/2000 | Ahn .............................. 438/619 |
| 6,054,172 A | | 4/2000 | Robinson et al. ............. 427/97 |
| 6,057,226 A | * | 5/2000 | Wong .......................... 438/623 |
| 6,059,553 A | | 5/2000 | Jin et al. ...................... 427/387 |
| 6,065,424 A | | 5/2000 | Shacham-Diamand et al. .......................... 118/696 |
| 6,069,068 A | | 5/2000 | Rathore et al. ............. 438/628 |
| 6,071,810 A | | 6/2000 | Wada et al. ................. 438/635 |
| 6,075,278 A | | 6/2000 | Farrar ......................... 257/522 |
| 6,075,287 A | | 6/2000 | Ingraham et al. |
| 6,091,136 A | | 7/2000 | Jiang et al. .................. 257/676 |
| 6,091,475 A | | 7/2000 | Ogino et al. ................. 349/149 |
| 6,100,193 A | | 8/2000 | Suehiro et al. ............. 438/685 |
| 6,121,126 A | | 9/2000 | Ahn et al. ................... 438/602 |
| 6,126,989 A | | 10/2000 | Robinson et al. ............. 427/97 |
| 6,136,095 A | | 10/2000 | Xu et al. ..................... 118/719 |
| 6,136,680 A | * | 10/2000 | Lai et al. ..................... 438/597 |
| 6,139,699 A | | 10/2000 | Chiang et al. ......... 204/192.15 |
| 6,140,228 A | | 10/2000 | Shan et al. .................. 438/653 |
| 6,140,234 A | | 10/2000 | Uzoh et al. ................. 438/678 |
| 6,140,456 A | | 10/2000 | Lee et al. .................... 528/196 |
| 6,143,641 A | * | 11/2000 | Kitch .......................... 438/618 |
| 6,143,646 A | | 11/2000 | Wetzel ........................ 438/637 |
| 6,150,261 A | | 11/2000 | Hsu et al. .................... 438/640 |
| 6,153,507 A | | 11/2000 | Mikagi ....................... 438/618 |
| 6,159,769 A | | 12/2000 | Farnworth et al. .......... 438/108 |
| 6,159,842 A | | 12/2000 | Chang et al. ................ 438/622 |
| 6,168,704 B1 | | 1/2001 | Brown et al. ............... 205/118 |
| 6,171,661 B1 | | 1/2001 | Zheng et al. ................ 427/535 |
| 6,177,350 B1 | | 1/2001 | Sundarrajan et al. ........ 438/688 |
| 6,183,564 B1 | | 2/2001 | Reynolds et al. ........... 118/719 |
| 6,187,656 B1 | | 2/2001 | Lu et al. ...................... 438/592 |
| 6,190,732 B1 | | 2/2001 | Omstead et al. ............ 118/729 |
| 6,194,233 B1 | | 2/2001 | Bedner et al. ................. 438/14 |
| 6,197,688 B1 | | 3/2001 | Simpson ..................... 438/678 |
| 6,204,065 B1 | | 3/2001 | Ochiai .......................... 436/66 |
| 6,207,222 B1 | | 3/2001 | Chen et al. .................. 427/97 |
| 6,207,553 B1 | | 3/2001 | Buynoski ..................... 438/622 |
| 6,207,558 B1 | | 3/2001 | Singhvi et al. ............. 438/648 |
| 6,208,016 B1 | | 3/2001 | Farrar ......................... 257/643 |
| 6,211,049 B1 | | 4/2001 | Farrar ......................... 438/597 |
| 6,211,073 B1 | | 4/2001 | Ahn et al. ................... 138/653 |
| 6,211,561 B1 | * | 4/2001 | Zhao ........................... 257/522 |
| 6,214,719 B1 | * | 4/2001 | Nag ............................ 438/619 |
| 6,218,282 B1 | * | 4/2001 | Buynoski .................... 438/619 |
| 6,221,763 B1 | | 4/2001 | Gilton et al. ................ 438/643 |
| 6,232,219 B1 | | 5/2001 | Blalock et al. ............. 438/637 |
| 6,245,658 B1 | * | 6/2001 | Buynoski .................... 438/619 |
| 6,245,668 B1 | * | 6/2001 | Brodsky et al. ............. 438/619 |
| 6,246,118 B1 | * | 6/2001 | Buynoski .................... 257/758 |
| 6,249,056 B1 | | 6/2001 | Kwon et al. ................ 257/758 |
| 6,265,311 B1 | | 7/2001 | Hautala et al. ............. 438/680 |
| 6,265,811 B1 | | 7/2001 | Takeuchi et al. |
| 6,268,276 B1 | * | 7/2001 | Chan et al. .................. 438/619 |
| 6,268,277 B1 | * | 7/2001 | Bang ........................... 438/619 |
| 6,271,592 B1 | | 8/2001 | Kim et al. ................... 257/751 |
| 6,281,585 B1 | * | 8/2001 | Bothra ........................ 257/758 |
| 6,284,656 B1 | | 9/2001 | Farrar ......................... 438/687 |
| 6,287,954 B1 | | 9/2001 | Ashley et al. ............... 438/622 |
| 6,288,442 B1 | | 9/2001 | Farrar ......................... 257/678 |
| 6,288,905 B1 | | 9/2001 | Chung ........................ 361/771 |
| 6,306,750 B1 | * | 10/2001 | Huang et al. ............... 438/612 |
| 6,323,543 B1 | | 11/2001 | Jiang et al. .................. 257/676 |
| 6,323,553 B1 | | 11/2001 | Hsu et al. .................... 257/751 |
| 6,326,303 B1 | | 12/2001 | Robinson et al. ........... 438/678 |
| 6,329,279 B1 | * | 12/2001 | Lee ............................. 438/619 |
| 6,342,448 B1 | | 1/2002 | Lin et al. .................... 438/687 |
| 6,342,722 B1 | * | 1/2002 | Armacost et al. ........... 257/522 |
| 6,358,842 B1 | | 3/2002 | Zhou et al. ................. 438/633 |
| 6,359,328 B1 | | 3/2002 | Dubin ......................... 257/622 |
| 6,368,954 B1 | | 4/2002 | Lopatin et al. ............. 438/627 |
| 6,372,622 B1 | | 4/2002 | Tan et al. .................... 438/612 |
| 6,376,370 B1 | | 4/2002 | Farrar ......................... 438/678 |
| 6,383,920 B1 | | 5/2002 | Wang et al. ................. 438/639 |
| 6,387,542 B1 | | 5/2002 | Kozlov et al. .............. 428/673 |
| 6,399,489 B1 | | 6/2002 | M'Saad et al. ............. 438/680 |
| 6,403,481 B1 | | 6/2002 | Matsuda et al. ............ 438/687 |
| 6,413,827 B1 | | 7/2002 | Farrar |
| 6,429,120 B1 | | 8/2002 | Ahn et al. ................... 438/635 |
| 6,448,331 B1 | * | 9/2002 | Ioka et al. ................... 524/859 |
| 6,495,445 B1 | | 12/2002 | Clevenger et al. .......... 438/619 |
| 6,518,198 B1 | | 2/2003 | Klein .......................... 438/758 |
| 6,563,219 B1 | | 5/2003 | Ireland et al. .............. 257/758 |
| 6,633,074 B1 | | 10/2003 | Ahn |
| 6,674,167 B1 | | 1/2004 | Ahn et al. ................... 257/750 |
| 2001/0054771 A1 | | 12/2001 | Wark et al. |
| 2002/0014646 A1 | | 2/2002 | Tsu et al. .................... 257/296 |
| 2002/0028552 A1 | | 3/2002 | Lee et al. .................... 438/243 |
| 2002/0096768 A1 | | 7/2002 | Joshi .......................... 257/750 |

OTHER PUBLICATIONS

Hymes, S., et al., "Passivation of Copper by Silicide Formation in Dilute Silane", *Conference Proceedings ULSI–VII*, pp. 425–431, (1992).

Quan, Y.C., et al., "Polymer–like Organic Thin Films Deposited by Plasma Enhanced Chemical Vapor Deposition Using the Para–xylene Precursor as Low Dielectric Constant Interlayer Dielectrics for Multilevel Metallization", *Jpn. J. Appl. Phys, 38*, pp. 1356–1358, (1999).

Shieh, B., et al., "Air–Gap Formation During IMD Deposition to Lower Interconnect Capacitance", *IEEE Electron Device Letters, 19 (1)*, pp. 16–18, (1998).

Uchida, Y., et al., "A Flourinated Organic–Silica Film with Extremely Low Dielectric Constant", *Jpn. J. Appl. Phys., 38*, pp. 2368–2372, (Apr. 1999).

Ueda, T., et al., "A novel Air Gap Integration Scheme for Multi–level Interconnects using Self–aligned Via Plugs", *Symposium on VLSI Technology Digest of Technical Papers*, pp. 46–47, (1998).

Abe, K., et al., "Sub–half Micron Copper Interconnects Using Reflow of Sputtered Copper Films", *VLSI Multilevel Interconnection Conference*, (Jun. 25–27, 1995),308–311.

American Society for Metals, *Metals Handbook, Ninth Edition*, vol. 2, Properties and Selection: Nonferrous Alloys and Pure Metals, ASM Handbook Committee, (eds.), American Society for Metals, Metals Park, OH,(1989),157, 395.

American Society for Metals, *Metals Handbook, 8th Edition*, vol. 8, Metals Park, Ohio,(1973),300–302.

American Society For Metals, "Phase Diagrams", *Metals Handbook*, 10th Ed., vol. 3, Metals Park, Ohio,(1992).

American Society for Metals, "Properties and Selection: Nonferrous Alloys and Pure Metals", *Metals Handbook*, 9th ed., vol. 2, Metals Park, Ohio,(1979).

Andricacos, P. C., "Copper On–Chip Interconnections", *The Electrochemical Society Interface*, (1999),pp. 32–37.

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, abstract, (Jul. 10, 1988), 1 pag.

Anonymous, "Improved Metallurgy for Wiring Very Large Scale Integrated Circuits", *International Technology Disclosures, 4*, Abstract,(1986), 1 page.

Bae, S., et al., "Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, (1997),p. 315.

Bai, G., "Copper Interconnection Deposition Techniques and Integration", *1996 Symposium on VLSI Technology*, Digest of Technical Papers,(1996),48–49.

Bernier, M., et al., "Laser processing of palladium for selective electroless copper plating", *SPIE, 2045*, (1994), pp.330–337.

Bhansali, S., et al., "A novel technique for fabrication of metallic structures on polymide by selective electroless copper plating using ion implantation", *Thin Solid Films, 270*, No. 1/02, (1995),pp. 489–492.

Bhansali, S., et al., "Selective electroless copper plating on silicon seeded by copper ion implantation", *Thin Solid Films, 253*, (1994),pp. 391–394.

Braud, F., "Ultra Thin Diffusion Barriers for Cu Interconnections at The Gigabit Generation and Beyond", *VMIC Conference Proceedings*, (1996),pp. 174–179.

Cabrera, A. L., et al., "Oxidation protection for a variety of transition metals and copper via surface silicides formed with silane containing atmospheres", *J. Mater. Res., 6(1)*, (1991), pp. 71–79.

Chakravorty, K. K., et al., "High–Density Interconnection Using Photosensitive Polyimide and Electroplated Copper Conductor Lines", *IEEE Transactions on Components, Hybrids, and Manufacturing Technology, 13(1)*, (Mar. 1990),200–206.

Craig, J. D., "Polymide Coatings", *Packaging, Electronic Materials Handbook, vol. 1*, ASM International Handbook Committee (eds.), ASM International, Materials Park, OH,(1989),767–772.

De Felipe, T. S., et al., "Electrical Stability and Microstructural Evolution in Thin Films of High Conductivity Copper Alloys", *IEEE*, (1999),pp. 293–295.

Ding, "Copper Barrier, Seed Layer and Planerization Technologies", *VMIC Conference Proceedings*, (1997),pp. 87–92.

Dubin, V. M., et al., "Selective and Blanket Electroless Copper Deposition for Ultralarge Scale Integration", *J. Electrochem. Soc., 144(3)*, (1997),pp. 898–908.

Dudzinski, N., et al., "The Youngs Modulus of Some Aluminum Alloys", *J. Institute of Metals, vol. LXXIV*, (1947–48),291–314.

Dushman, S., et al., *Scientific Foundations of Vacuum Technique, 2nd Edition*, John Wiley and Sons,(1962),1–806.

Edelstein, D., "Full Copper Wiring in a Sub–0.25 micrometer CMOS ULSI Technology", IEDM, (1997),pp. 773–776.

Eisenbraun, E. T., et al., "Selective and Blanket Low–Temperature Copper CVD for Multilevel Metallization in ULSI", *Conference Proceedings ULSI–VII*, (1992),5 pages.

Eldridge, J. M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN,(1987),pp. 283–285.

Ernst, et al., "Growth Model for Metal Films on Oxide Surface: Cu on ZnO(0001)–O", *Physical Review B, 47*, (May 15, 1993),13782–13796.

Fleming, J. G., et al., "Use Of Air Gap Structures To Lower Level Intralevel Capacitance", *Proceedings of the 1997 Dielectrics for ULSI Multi–level Interconnect Conference*, (1997),140.

Fukuda, T., et al., "0.5 –micrometer–Pitch Copper–Dual–Damascene Metallization Using Organic SOG (k=2.9) for 0.18–micrometer CMOS Applications", *Electron Devices Meeting, 1999:IEDM Technical Digest International*, (1999),619–622.

Gladlfelter, W. L., et al., "Trimethylamine Complexes of Alane as Precursors for the Low–Pressure Chemical Vapor Deposition of Aluminum", *Chemistry of Materials, 1*, (1989),pp. 339–343.

Godbey, D. J., et al., "Copper Diffusion in Organic Polymer Resists and Inter–level Dielectrics", *Thin Solid Films, 308–309*, (1997),pp. 470–474.

Grill, A., et al., "Low dielectric constant films prepared by plasma–enhanced chemical vapor deposition from tetramethvisilane", *Journal of Applied Physics, 85(6)*, (1999), 3314–3318.

Grimblot, J., et al., "II. Oxidation of Aluminum Films", *J. Electrochem., 129*, (1982),pp. 2369–2372.

Hattangady, S. V., et al., "Integrated processing of silicon oxynitride films by combined plasma and rapid–thermal processing", *J. Vac. Sci. Technol. A. 14(6)*, (1996),pp. 3017–3023.

Hirao, S., et al., "A Novel Copper Reflow Process Using Dual Wetting Layers", *Symposium on VLSI Technology*, Digest of Technical Papers,(1997),57–58.

Hirata, A., et al., "WSiN Diffusion Barrier Formed by ECR Plasma Nitridation for Copper Damascene Interconnection", *16th Solid State Devices and Materials*, (1998),pp. 260–261.

Holloway, K., et al., "Tantalum as a diffusion barrier between copper and silicon", *Appl. Phys. Lett., 57(17)*, (Oct. 1990),pp. 1736–1738.

Hu, C. K., et al., "Extendibility of Cu Damascene to 0.1 micrometer Wide Interconnections", *Mat. Res. Soc. Symp. Proc. 514*, (1998),pp. 287–292.

Hymes, S., et al., "Passivation of Copper by Silicide Formation in Dilute Silane", *Conference Proceedings ULSI–VII*, (1992),pp. 425–431.

Iijima, T., "Microstructure and Electrical Properties of Amorphous W–Si–N Barrier Layer for Cu Interconnections", *1996 VMIC Conference*, (1996),pp. 168–173.

Izaki, M., et al., "Characterization of Transparent Zinc Oxide Films Prepared by Electrochemical Reaction", *Journal of the Electrochemical Society, 144*, (Jun. 1997), 1949–1952.

Jayaraj, K., et al., "Low Dielectric Constant Microcellular Foams", *Proceedings from the Seventh Meeting of the DuPont Symposium on Polymides in Microelectrics*, (Sep. 1996),474–501.

Jeon, Y., et al., "Low–Temperature Fabrication of Polycrystalline Silicon Thin Films by ECR Pecvd", *The Electrochemical Society Proceedings, 94(35)*, (1995),pp. 103–114.

Jin, C., et al., "Porous Xerogel Films as Ultra–low Permittivity Dielectrics for ULSI Interconnect Applications", *Conference Proceedings ULSI XII—1997 Materials Research Society*, (1997),463–469.

Kaloyeros, A. E., et al., "Blanket and Selective Copper CVD from Cu(FOD)2 for Multilivel Metallization", *Mat. Res. Soc. Symp. Proc.*, vol. 181,(1990),6 pages.

Kamins, T. I., "Structure and Properties of LPCVD Silicon Films", *J. Electrochem. Soc.: Solid–State Science and Technology, 127*, (Mar. 1980),pp. 686–690.

Kang, H. K., et al., "Grain Structure and Electromigration Properties of CVD CU Metallization", *Proceedings of the 10th International VLSI Multilevel Interconnection Conference*, (Jun. 8–9, 1993),223–229.

Keppner, H.; et al., "The "Micromorph" Cell: A New Way to High–Efficiency–Low–Temperature Crystalline Silicon Thin–Film Cell Manufacturing", *Mat. Res. Soc. Symp. Proc., 452*, (1997),pp. 865–876.

Kiang, M., et al., "Pd/Si plasma immersion ion implantation for selective electroless copper plating on SiO2", *Appl. Phys. Lett., 60*, (1992),pp.2767–2769.

Kirk, Raymond E., *Kirk–Othmer Concise Encyclopedia of Chemical Technology*, Grayson, M., (ed.), John Wiley & Sons, Inc., New York, NY,(1985),433–435, 926–938.

Kistiakowsky, G. B., et al., "Reactions of Nitrogen Atoms. I. Oxygen and Oxides of Nitrogen", *The Journal of Chemical Physics, 27(5)*, (1957),pp. 1141–1149.

Klaus, J W., et al., "Atomic Layer Deposition of Tungsten Nitride Films Using Sequential Surface Reactions", *Journal of the Electrochemical Society*, vol. 147, No. 3, (Mar. 2000),1175–1181.

Laursen, T. , "Encapsulation of Copper by Nitridation of Cu–Ti Alloy/Bilayer Structures", *International Conference on Metallurgical Coatings and Thin Films*, Abstract No. H1.03, San Diego, CA,(Apr. 1997),p. 309.

Len, V., et al., "An investigation into the performance of diffusion barrier materials against copper diffusion using metal–oxide–semiconductor (MOS) capacitor structures", *Solid–State Electronics, 43*, (1999),pp. 1045–1049.

Lyman, T., et al., "Metallography, Structures and Phase Diagrams", *Metals Handbook, 8*, American Society for Metals, Metals Park, Ohio,(1989), pp. 300 & 302.

Marcadal, C., "OMCVD Copper Process for Dual Damascene Metallization", *VMIC Conference*, ISMIC,(1997),pp. 93–97.

Miller, R. D., et al., "Low Dielectric Constant Polyimides and Polyimide Nanofoams", *Seventh Meeting of the DuPont Symposium on Polymides in Microelectronics*, (Sep. 1996), pp. 443–473.

Min, Jae–Sik , et al., "Metal–Organic Atomic–Layer Deposition of Titanium–Silicon–Nitride Films", *Applied Physics Letters*, vol. 75, No. 11,(1999),pp. 1521–1523.

Min, J., "Metal–organic atomic–layer deposition of titanium–silicon–nitride films", *Applied Physics Letters, 75(11)*, (1999),1521–1523.

Miyake, T., et al., "Atomic Hydrogen Enhanced Reflow of Copper", *Applied Physics Letters, 70(10)*, (1997),1239–1241.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE, 2335*, (1994),pp. 80–90.

Nakao, S., et al., "Thin and Low–Resistivity Tantalum Nitride Diffusion Barrier and Giant–Grain Copper Interconnects for Advanced ULSI Metallization", *Japanese Journal of Applied Physics, 38(4B)*, (Apr. 1999),pp. 262–263.

Newboe, B., et al., "Applied Materials Announces First Barrier/Seed Layer System For Copper Interconnects", *Applied Materials*, http://www.appliedmaterials.com/newsroom/pr–00103.html,(1997),pp.1–4.

Okamoto, Y., et al., "Magnetically Excited Plasma Oxynitridation of Si at Room Temperature", *Jpn. J. Appl. Phys., 34*, (1995),pp. L955–L957.

Palleau, J., et al., "Refractory Metal Encapsulation in Copper Wiring", *Advanced Metallization for Devices and Circuits–Science, Technology and Manufacturability, Materials Research Society Symposium Proceedings, 337*, (Apr. 1994), 225–231.

Park, C. W., et al., "Activation Energy for Electromigration in Cu Films", *Applied Physics Letters, 59(2)*, (Jul. 6, 1991), 175–177.

Quan, Y. C., et al., "Polymer–like Organic Thin Films Deposited by Plasma Enhanced Chemical Vapor Deposition Using the Para–xylene Precursor as Low Dielectric Constant Interlayer Dielectrics for Multilevel Metallization", *Japanese Journal of Applied Physics*, vol. 38, Part 1, No. 3A, (1999), 1356–1358.

Radzimski, Z. J., et al., "Directional Copper Deposition using d–c Magnetron Self–sputtering", *J. Vac. Sci. Technol. B, 16(3)*, (1998), pp. 1102–1106.

Ramos, T , et al., "Nanoporous Silica for Dielectric Constant Less Than 2", *Conference Proceedings ULSI XII—1997 Materials Research Society*, (1997),455–461.

Rath, J. K., et al., "Low–Temperature deposition of polycrystalline silicon thin films by hot–wire CVD", *Solar Energy Materials and Solar Cells, 48*, (1997),pp. 269–277.

Ray S. K., et al., "Flourine–enhanced nitridation of silicon at low temperatures in a microwave plasma", *J. Appl. Phys., 70(3)*, (1991),pp. 1874–1876.

Rossnagel, S. M., "Magnetron Sputter Deposition of Interconnect Applications", *Conference Proceedings, ULSI XI*, (1996),227–232.

Rossnagel, S. M., et al., "Metal ion deposition from ionized mangetron sputtering discharge", *J. Vac. Sci. Technol. B, 12(1)*, (1994),pp. 449–453.

Ryan, J. G., "Copper Interconnects for Advanced Logic and DRAM", Extended Abstracts of the 1998 International Conference on Solid–State Devices and Materials, Hiroshima, (1998),pp. 258–259.

Ryu, C., et al., "Barriers for copper interconnections", *Solid State Technology*, (Apr. 1999),pp. 53,54,56.

Saarivirta, M. J., "High Conductivity Copper Rich Cu–Zr Alloys", *Transactions of the Metallurgical Society of AIME, 218*, (1960),pp. 431–437.

Senzaki, Y. , "Chemical Vapor Deposition of Copper using a New Liquid Precursor with Improved Thermal Stability", *Conference Proceedings ULSI XIII, Materials Research Society*, (1998),pp. 451–455.

Shacham–Diamand, Y. , "100 nm Wide Copper Lines Made by Selective Electroless Deposition", *Journal of Micromechanics and Microengineering, 1*, (Mar. 1991),66–72.

Shacham–Diamand, Yosi , et al., "Copper electroless deposition technology for ultra–large–scale–intergration (ULSI) metallization", *Microelectronic Engineering, NL, vol. 33, No. 1, XP004054497*, (1997),47–58.

Shacham–Diamand, Y. , et al., "Copper electroless deposition technology for ultra–large–scale–integration (ULSI) metallization", *Microelectronic Engineering, 33*, (1997),pp. 47–58.

Shieh, B., et al., "Air-Gap Formation During IMD Deposition to Lower Interconnect Capacitance", *IEEE Electron Device Letters, 19(1)*, (1998), 16–18.

Singer, Ferdinand L., "Strength of Materials", *Harper & Brothers, New York*, (1951),229–32.

Srivatsa, A. R., et al., "Jet Vapor Deposition: an Alternative to Electrodeposition", *Surface Engineering, 11*, (1995),75–77.

Stroud, P. T., et al., "Preferential deposition of silver induced by low energy gold ion implantation", *Thin Solid Films, Switzerland*, vol. 9, No. 2, XP000993098, (Feb. 1972), 273–281.

Tao, J., et al., "Electromigration Characteristics of Copper Interconnects", *IEEE Electron Devices Letters*, 14(5), (May 1993),249–251.

Ting, C. H., "Methods and Needs for Low K Material Research", *Materials Research Society Symposium Proceedings*, vol. 381, Low–Dielectric Constant Materials—Synthesis and Applications in Microelectronics, Lu, T.M., et al., (eds.), San Francisco, CA,(Apr. 17–19, 1995),3–17.

Tsukada, T., et al., "Adhesion of copper films on ABS polymers deposited in an internal magnet magnetron sputtering system", *J. Vac. Sci. Technol.*, 16(2), (1979),348–351.

Uchida, Y., et al., "A Fluorinated Organic–Silica Film with Extremely Low Dielectric Constant", *Japanese Journal of Applied Physics*, vol. 38 Part1 No. 4B, (Apr. 1999),2368–2372.

Ueda, T., et al., "A novel Air Gap Integration Scheme for Multi–level Interconnects using Self–aligned Via Plugs", *Symposium on VLSI Technology Digest of Technical Papers*, (1998), 46–47.

Van Vlack, Lawrence H., "Elements of Materials Science", *Addison–Wesley Publishing Co., Inc. Reading, MA*, (1959), 468.

Venkatesan, S., et al., "A High Performance 1.8V, 0.20 micrometer CMOS Technology with Copper Metalization", *IEEE*,(1997),pp. 769–772.

Vossen, J. L., et al., *Thin Film Processes II*, Academic Press, Inc.,(1991), 1–866.

Wang, X. W., et al., "Highly Reliable Silicon Nitride Thin Films Made by Jet Vapor Deposition", *Japanese Journal of Applied Physics*, vol. 34, Part1, No. 2B, (Feb. 1995),955–958.

Wang, K., et al., "Very Low Temperature Deposition of Polycrystalline Silicon Films with Micro–Meter–Order Grains on SiO2", *Mat. Res. Soc. Symp. Proc.*, 355, (1995), pp. 581–586.

Winters, H. F., et al., "Influence of Surface Absorption Characteristics on Reactivity Sputtered Films Grown in the Biased and Unbiased Modes", *J. Appl. Phys.*, 43(3), (1972), pp. 794–799.

Wolf, S., et al., *Silicon Processing for the VLSI Era, vol. 1—Process Technology*, Lattice Press, Sunset Beach, CA,(1986),514–538.

Wolf, S., "Chapter 4: Multilevel–Interconnect Technology for VLSI and ULSI", *Silicon Processing for the VLSI Era, vol. 2 Process Integration*, Lattice Press, Sunset Beach, CA,(1990),176–297.

Yeh, J. L., et al., "Selective Copper plating of Polysilicon Surface Micromachined Structures", *Solid–State Sensor and Actuator Workshop*, (1998),pp. 248–251.

Zhang, J., et al., "Investigations of photo–induced decomposition of palladium acetate for electroless copper plating", *Thin Solid Films*, 318, (1998),pp. 234–238.

\* cited by examiner

MULTILEVEL COPPER INTERCONNECTS WITH LOW-K DIELECTRICS AND AIR GAPS

RELATED APPLICATIONS

This application is a Divisional of U.S. Ser. No. 09/583,514 filed on May 31, 2000, U.S. Pat. No. 6,423,629 which is incorporated herein by reference.

This application is related to the following co-pending and commonly assigned application; application Ser. No. 09/483,881, entitled "Selective Electroless-Plated Copper Metallization," which is hereby incorporated by reference.

FIELD OF THE INVENTION

The present invention relates generally to integrated circuits. More particularly, it pertains to structures and methods for multilevel copper interconnects with low-k dielectric constants and air gaps.

BACKGROUND OF THE INVENTION

As the integrated circuit (IC) technology makes rapid progress toward 100 nm gate transistors, the speed limiting factor is no longer the transistor delay, but the RC delay associated with the metal interconnects. A great deal of work is being done in this area on new and innovative materials and fabrication techniques to reduce the capacitance and thus reduce RC delay of interconnects. Currently studied low-k dielectrics include fluorinated silicon dioxide ($SiO_2$), aerogels, and polymers. Additionally, as IC technology continues to scale, the aspect ratio of metal lines increases and the intra-level line-to-line capacitance increasingly dominates over the inter-level capacitance. Thus, it becomes increasingly important to implement low-k schemes between tightly spaced metal lines and less so between metal levels.

One approach to reducing the RC delay is provided in copending and commonly assigned application; attorney docket number 303.672US1, application Ser. No. 09/483881, entitled "Selective Electroless-Plated Copper Metallization," which is hereby incorporated by reference. Further, an article by B. Shieh et al., entitled "Air-Gap Formation During IMD Deposition to Lower Interconnect Capacitance," *IEEE Electron Devices Letters*, 19, no. 1, p. 16–18 (1998) presented simulations and some initial experimental results showing the possible capacitance reduction achievable using air-gap structures.

Another approach is described in an article by T. Ueda et al., entitled "A Novel Air Gap Integration Scheme for Multi-level Interconnects using Self-aligned Via Plugs," 1998 Symposium on VLSI Technology, *Digest of Technical Papers*, p. 46–47 (1998) in which an air-gap structure was introduced between lines and $SiO_2$ was provided between metal levels. As described in this article, an effective dielectric constant of 1.8 at 0.3 micrometer (μm) line spacing was obtained. The authors of this article used the combination of PE-CVD $SiO_2$ with poor step coverage characteristics to intentionally form the air gaps, and biased HDP-CVD $SiO_2$ with good filling capability for the formation of inter-metal dielectric (IMD). In another approach described by J. G. Fleming et al., entitled "Use of Air Gap Structures to Lower Intra-level Capacitance," *Proceedings of* 1997 Dielectrics for ULSI Multi-level Interconnect Conference, p. 139 (1997) a process of fabricating air-gap structures to lower intra-level capacitance was introduced. The authors of this article used an oxide deposition process with poor step coverage to create the desired air gaps. Yet another approach is described in U.S. Pat. No. 5,900,668, by D. L. Wollesen, entitled "Low Capacitance Interconnection," issued May 4, 1999, which describes a scheme in which the parasitic capacitance is reduced by removing sections of dielectric inter-layers by anisotropic etching to form air-gaps which can remain or be filled with another dielectric material with a lower dielectric constant. An example of a prior art multilevel metallization scheme according to this process is provided in FIG. 1.

Still, all of these approaches either involve complex additional processing steps or fail to provide an added benefit of reducing both intral-level line to line capacitance and the inter-level capacitance. Accordingly, there remains a need in the art to provide streamlined, improved methods and structures for alleviating the capacitance problems associated with via and metal line fabrication processes as design rules shrink.

SUMMARY OF THE INVENTION

The above mentioned problems associated with integrated circuit size and performance, the via and metal line formation process, and other problems are addressed by the present invention and will be understood by reading and studying the following specification. Structures and methods are provided which include a selective electroless copper metallization. The present invention provides for a multilayer copper wiring structure by electroless, selectively deposited copper in a streamlined process which further reduces both intra-level line to line capacitance and the inter-level capacitance.

In particular, an illustrative embodiment of the present invention includes a novel methodology for forming multi-level wiring interconnects in an integrated circuit assembly. The method includes forming a number of multilayer metal lines, e.g. copper lines formed by selective electroless plating, separated by air gaps above a substrate. A low dielectric constant material is deposited between the number of metal lines and the substrate using a directional process. According to the teachings of the present invention, using a directional process includes maintaining a number of air gaps in the low dielectric constant material.

In one embodiment, depositing a low dielectric constant material includes depositing an organic silica film. In one embodiment, depositing a low dielectric constant material between the number of metal lines and the substrate using a directional process includes using a microwave plasma-assisted supersonic jet deposition process. In another, depositing a low dielectric constant material between the number of metal lines and the substrate using a directional process includes using a quasi hydrogen-free chemical vapor deposition process. In another, depositing a low dielectric constant material includes forming a low dielectric constant film by radio frequency plasma enhanced chemical vapor deposition using tetramethylsilane. In still another, depositing a low dielectric constant material includes depositing a polymer-like organic thin film by plasma-enhance chemical vapor deposition using a para-xylene precursor.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Substrate includes doped and undoped semiconductors, epitaxial semiconductor layers supported by a base semiconductor or insulator, as well as other semiconductor structures well known to one skilled in the art. The term insulator is defined to include any material that is less electrically conductive than the materials generally referred to as conductors by those skilled in the art. The following detailed description is, therefore, not to be taken in a limiting sense.

Figure 1:
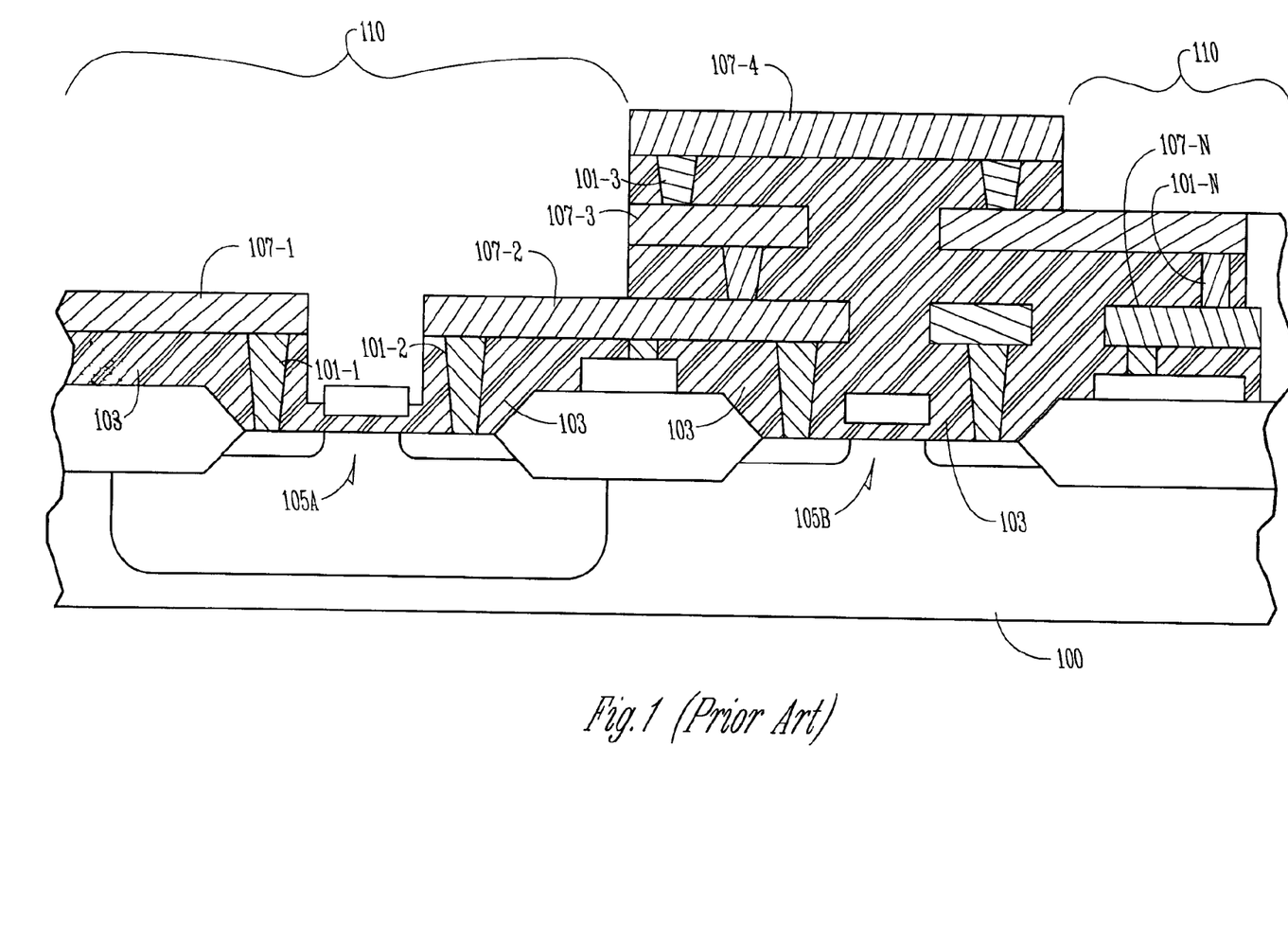
FIG. 1 illustrates a multilevel wiring interconnect scheme according to the teachings of the prior art.

The prior art in FIG. 1, shows a number of vias 101-1, 101-2, 101-3, . . . , 101-N are formed in an insulator material 103, e.g. silicon dioxide ($SiO_2$), contacting with a substrate 100. As one of ordinary skill in the art will recognize, any number of semiconductor devices, e.g. 105A and 105B, can be formed in the substrate to which the number of vias 101-1, 101-2, 101-3, . . . , 101-N make electrical contact. Also, as shown in FIG. 1, a number of metal lines 107-1, 107-2, 107-3, . . . , 107-N are sandwiched and electrically couple between the number of vias 101-1, 101-2, 101-3, . . . , 101-N in order to form a multilevel wiring interconnect.

Conventionally, to form vias and aluminum wire metal lines, fabricators use a dual-damascene metallization technique, which takes its name from the ancient Damascene metalworking art of inlaying metal in grooves or channels to form ornamental patterns. The dual-damascene technique entails covering the components on a wafer with an insulative layer 103, etching small holes in the insulative layer 103 to expose portions of the components underneath in substrate 100, and subsequently etching shallow trenches from hole to hole to define a number of metal lines. Fabricators then blanket the entire insulative layer with a layer of aluminum or other conductive material and polish off the excess, leaving behind conductive vias, or contact plugs, in the holes and conductive lines in the trenches.

As shown in the prior art of FIG. 1, a metal conductive material such as Aluminum can be deposited in the openings of in the insulator 103 using an electroplated metal deposition technique. As shown in FIG. 1, the metal conductive material, e.g. the number of vias 101-1, 101-2, 101-3, . . . , 101-N and the number of metal lines 107-1, 107-2, 107-3, . . . , 107-N, fills the holes and the trenches.

FIG. 1 illustrates the structure after the excess metal conductive material has been removed through a chemically mechanical planarization (CMP) process step. In FIG. 1, additional etching steps have been performed to create air gaps in certain regions such as regions 110. One of ordinary skill in the art will understand, upon viewing the structure of FIG. 1, the limits on the ability to form air gaps between the intra-level line to line spacing as well as the limits on the ability to form inter-level air gaps according to this prior art method.

The purpose of this invention is to disclose a simple method of fabricating a multi-level interconnect with copper to reduce resistance and a combination of air-gaps and low dielectric constant insulators, e.g. low-k dielectrics, to reduce capacitance. According to one embodiment of the present invention, a selective copper deposition by electroless deposition at or near room temperature is used, as disclosed by K. Y. Ahn and Leonard Forbes in copending and commonly assigned application Ser. No. 09/483881, entitled "Selective Electroless-Plated Copper Metallization," which is hereby incorporated by reference.

Figure 2A:
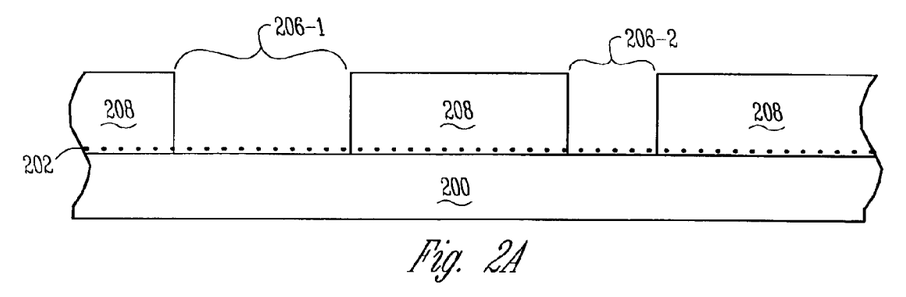
FIGS. 2A–2F illustrate an embodiment of the various processing steps for a selective electroless-plated copper metallization and multilevel wiring interconnect scheme according to the teachings of the present invention.

FIGS. 2A–2E illustrate an embodiment of the various processing steps for a selective electroless-plated copper metallization and multilevel wiring interconnect scheme according to the teachings of the present invention. As shown in FIGS. 2A, a seed layer, or first seed layer, 202 is deposited on a substrate 200. In one embodiment, depositing the first seed layer 202 on the substrate 200 includes depositing a thin film of Palladium (Pd) on the substrate 200. In another embodiment, depositing the first seed layer 202 on the substrate 200 includes depositing a thin film of Copper (Cu) on the substrate. In one embodiment, the seed layer 202 is deposited to have a thickness of less than 15 nanometers (nm). In one embodiment, the seed layer 202 is deposited to form a barely continuous film in the thickness range of 3 to 10 nm. In another embodiment, the seed layer 202 is deposited such that the seed layer possesses a discontinuous island structure in the thickness range of 3 to 10 nm. In one embodiment, the seed layer 202 is deposited using a physical vapor deposition process. For example, in one embodiment, the seed layer 202 is deposited using a sputtering deposition technique. In another embodiment, the seed layer 202 is deposited using an evaporation deposition technique. One of ordinary skill in the art will understand, upon reading this disclosure, the manner in which such physical vapor deposition processes can be performed to form the seed layer 202 described herein.

A photolithography technique is used to define a number of via holes, conductor openings, e.g. openings 206-1 and 206-2, above the seed layer 202 on the substrate 200. As one of ordinary skill in the art will understand upon reading this disclosure, using a photolithography technique to define a number of holes 206-1 and 206-2, includes patterning a photoresist layer 208 to define the number via holes, or openings 206-1 and 206-2 over the seed layer 202. One of ordinary skill in the art will also understand upon reading this disclosure, the manner of forming the patterned photoresist layer, or first patterned photoresist layer, 208. For example, a photoresist layer can be deposited over the seed layer 202 using any suitable technique, e.g. by spin coating.

Then the photoresist can be masked, exposed, and washed to define the number of via holes, or openings 206-1 and 206-2 to the seed layer 202. One of ordinary skill in the art will further understand, upon reading this disclosure, that the thickness of the photoresist layer 202 is scalable. That is, the deposition of the photoresist layer 208 is controllable such that the photoresist thickness can be set at a predetermined height (h1). Thus, the scalable thickness of the photoresist layer 208 determines a height (h1), or depth (h1) for the number of via holes, or openings 206-1 and 206-2. The structure is now as shown in FIG. 2A.

Figure 2B:
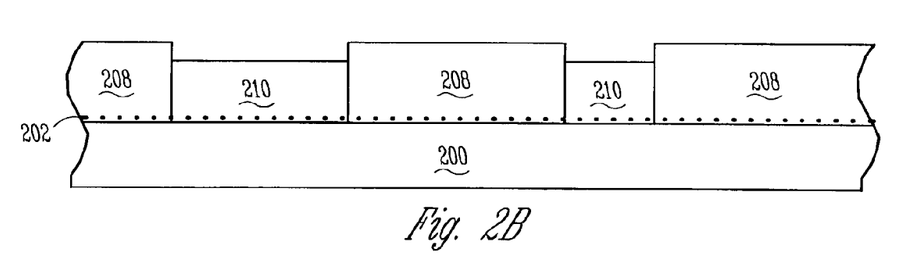

FIG. 2B illustrates the structure after the next sequence of processing steps. In FIG. 2B, a first conductive metal layer is deposited over the structure. One of ordinary skill in the art will understand upon reading this disclosure that the invention is equally applicable for forming multilevel wiring interconnect structures using conductive metal lines and vias other than copper, such as, aluminum, gold and silver. However, for convenience, the fabrication step discussed herein was focused on using copper for the metal lines and vias. Thus, as shown in FIG. 2B, a layer of copper, first layer of copper, or first level of copper vias 210 is deposited over the seed layer 202 using electroless plating. In an alternative embodiment, the first layer of copper can be a first level of copper metal lines 210. The invention is not so limited. One of ordinary skill in the art will understand upon reading this disclosure the various manner in which the layer of copper, first layer of copper, or first level of copper vias 210 can be deposited over the seed layer 202 using electroless plating. According to the teachings of the present invention, the layer of copper, first layer of copper, or first level of copper vias 210 is formed in the number of via holes, or openings, 206-1 and 206-2. According to the teachings of the present invention depositing the layer of copper, first layer of copper, or first level of copper vias 210 over the seed layer 202 is such that the layer of copper, first layer of copper, or first level of copper vias 210 form on the seed layer 202 but not on the patterned photoresist layer 208. The structure is now as appears in FIG. 2B.

Figure 2C:
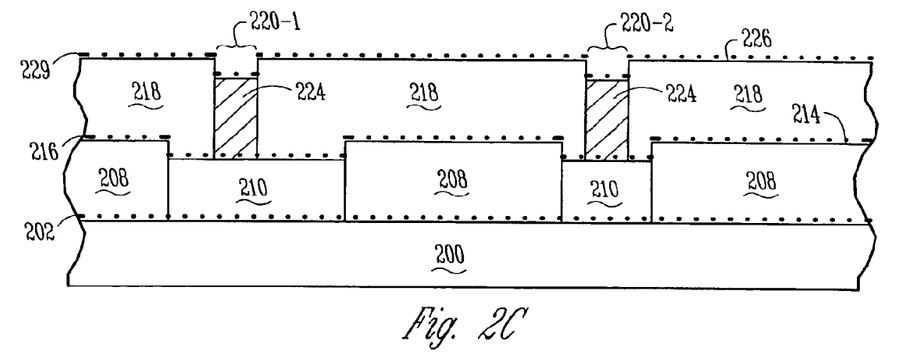

FIG. 2C illustrates the structure following the next sequence of processing steps. In FIG. 2C, another seed layer, or second seed layer, 216 is deposited on the first layer of copper, or first level of copper vias 210 and the top surface 214 of the first patterned photoresist layer 208. In one embodiment, depositing the second seed layer 216 on the first layer of copper, or first level of copper vias 210 and the top surface 214 of the first patterned photoresist layer 208 includes depositing a thin film of Palladium (Pd). In another embodiment, depositing the second seed layer 216 on the first layer of copper, or first level of copper vias 210 and the top surface 214 of the first patterned photoresist layer 208 includes depositing a thin film of Copper (Cu). Again in one embodiment, the second seed layer 216 is deposited to have a thickness of less than 15 nanometers (nm). In one embodiment, the second seed layer 216 is deposited to form a barely continuous film in the thickness range of 3 to 10 nm. In another embodiment, the second seed layer 216 is deposited such that the second seed layer 216 possesses a discontinuous island structure 216 having an island thickness in the range of 3 to 10 nm.

In one embodiment, the second seed layer 216 is deposited using a physical vapor deposition process. For example, in one embodiment, the second seed layer 216 is deposited using a sputtering deposition technique. In another embodiment, the second seed layer 216 is deposited using an evaporation deposition technique. One of ordinary skill in the art will understand, upon reading this disclosure, the manner in which such physical vapor deposition processes can be performed to form the second seed layer 216 described herein.

A second patterned photoresist layer 218 is deposited above the second seed layer 216, which defines a number of conductor line openings, e.g. conductor line openings 220-1 and 220-2. In one embodiment, depositing the second patterned photoresist layer 218 which defines a number of conductor line openings 220-1 and 220-2, or first level metal line openings. In one embodiment, the number of conductor line openings 220-1 and 220-2 are defined to form a number of conductor line openings 220-1 and 220-2 having a near minimum width and spacing. As one of ordinary skill in the art will understand upon reading this disclosure, this insures a sufficient space in the structure for a subsequent removal of the photoresist layers, e.g. first patterned photoresist layer 208, on lower levels. This consideration is also discussed in copending and commonly assigned application; attorney docket number 303.672US1, application Ser. No. 09/483881, entitled "Selective Electroless-Plated Copper Metallization," which is hereby incorporated by reference. One of ordinary skill in the art will understand upon reading this disclosure, the manner of forming the second patterned photoresist layer 218. For example, a photoresist layer can be deposited over the second seed layer 216 using any suitable technique, e.g. by spin coating. Then the photoresist can be masked, exposed, and washed to define the number of conductor line openings 220-1 and 220-2 to the second seed layer 216. One of ordinary skill in the art will further understand, upon reading this disclosure, that the thickness of the second patterned photoresist layer 218 is scalable. That is, the deposition of the photoresist layer 218 is controllable such that the photoresist thickness can be set at a predetermined height (h2). Thus, the scalable thickness of the second patterned photoresist layer 218 determines a height (h2), or depth (h2) for the number of conductor line openings 220-1 and 220-2.

As shown in FIG. 2C, another layer of copper, second layer of copper, or first level of conductor lines 224 is deposited or formed in the number of conductor line openings 220-1 and 220-2 using electroless plating. One of ordinary skill in the art will understand upon reading this disclosure the various manner in which this next layer of copper, second layer of copper, or first level of conductor lines 224 can be deposited in the number of conductor line openings 220-1 and 220-2 using electroless plating. According to the teachings of the present invention depositing this next layer of copper, second layer of copper, or first level of conductor lines 224 over the second seed layer 216 is such that this next layer of copper, second layer of copper, or first level of conductor lines 224 form on the second seed layer 216 but not on the second patterned photoresist layer 218. The structure is now as appears in FIG. 2C.

Next, as shown in FIG. 2C, another seed layer, or third seed layer, 229 is deposited on the second layer of copper, or first level of conductor lines 224 and the top surface 226 of the second patterned photoresist layer 218. In one embodiment, depositing the third seed layer 229 on the second layer of copper, or first level of conductor lines 224 and the top surface 226 of the second patterned photoresist layer 218 includes depositing a thin film of Palladium (Pd). In another embodiment, depositing the third seed layer 229 on the second layer of copper, or first level of conductor lines 224 and the top surface 226 of the second patterned photoresist layer 218 includes depositing a thin film of Copper (Cu). Again in one embodiment, the third seed layer 229 is deposited to have a thickness of less than 15 nanometers (nm). In one embodiment, the third seed layer 229 is deposited to form a barely continuous film in the thickness range of 3 to 10 nm. In another embodiment, the third seed layer 229 is deposited such that the third seed layer 229 possesses a discontinuous island structure 229 having an island thickness in the range of 3 to 10 nm.

In one embodiment, the third seed layer 229 is deposited using a physical vapor deposition process. For example, in one embodiment, the third seed layer 229 is deposited using a sputtering deposition technique. In another embodiment, the third seed layer 229 is deposited using an evaporation deposition technique. One of ordinary skill in the art will understand, upon reading this disclosure, the manner in which such physical vapor deposition processes can be performed to form the third seed layer 229 described herein.

Figure 2D:
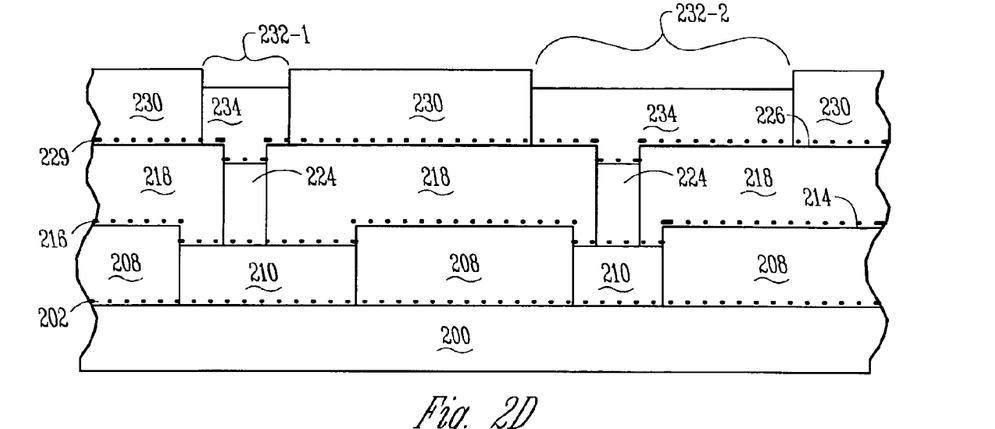

FIG. 2D illustrates the structure following the next sequence of processing steps. In FIG. 2D, a third patterned photoresist layer 230 is deposited above the third seed layer 229, which defines a number of via holes, or openings, e.g. openings 232-1 and 232-2, to the third seed layer 229. One of ordinary skill in the art will understand upon reading this disclosure, the manner of forming the third patterned photoresist layer 230. For example, a photoresist layer can be deposited over the third seed layer 229 using any suitable technique, e.g. by spin coating. Then the photoresist can be masked, exposed, and washed to define the number of via holes, or openings 232-1 and 232-2 to the third seed layer 229. One of ordinary skill in the art will further understand, upon reading this disclosure, that the thickness of the second patterned photoresist layer 218 is scalable. That is, the deposition of the photoresist layer 230 is controllable such that the photoresist thickness can be set at a predetermined height (h3). Thus, the scalable thickness of the second patterned photoresist layer 230 determines a height (h3) for the number of via holes, or openings 232-1 and 232-2.

In FIG. 2D, another layer of copper, third layer of copper, or second level of copper vias 234 is deposited or formed over the third seed layer 229 using electroless plating. One of ordinary skill in the art will understand upon reading this disclosure the various manner in which the third layer of copper, or second level of copper vias 234 can be deposited over the third seed layer 229 using electroless plating. According to the teachings of the present invention, the third layer of copper, or second level of copper vias 234 is formed in the number of via holes, or openings 232-1 and 232-2 to the third seed layer 229. Forming the third layer of copper, or second level of copper vias 234 includes filling the number of via holes, or openings 232-1 and 232-2. According to the teachings of the present invention, depositing third layer of copper, or second level of copper vias 234 over the third seed layer 229 is such that the third layer of copper, or second level of copper vias 234 form on the third seed layer 229 but not on the third patterned photoresist layer 230. The structure is now as appears in FIG. 2D.

Figure 2E:
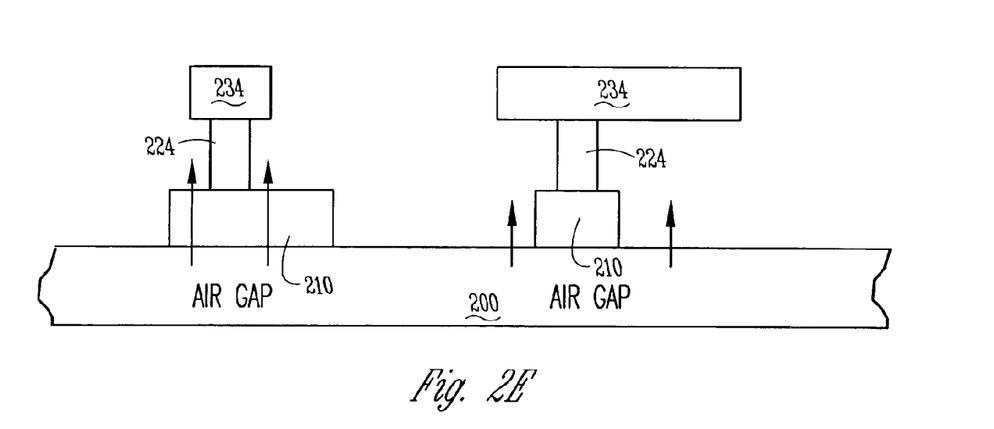

FIG. 2E illustrates the structure following the next sequence of processing steps. In FIG. 2E, the first, second, and third patterned photoresist layers 208, 218, and 230 are removed. In one embodiment, removing the first, second, and third patterned photoresist layers 208, 218, and 230 includes removing the first, second, and third patterned photoresist layers 208, 218, and 230 using an oxygen plasma etching. According to the teachings of the present invention, the method further includes removing the first, second, and third seed layers, 202, 216, and 229 respectively, with the photoresist layers from areas on the substrate which are not beneath the number of copper vias or between the conductive metal lines and the vias. As one of ordinary skill in the art will understand from reading this disclosure, this is due to the present invention's novel methodology where the seed layers, 202, 216, and 229, can be deposited to have a thickness of less than 15 nanometers (nm), thus forming a barely continuous thin film and/or discontinuous island structure. Other suitable techniques for removing the first, second, and third patterned photoresist layers 208, 218, and 230 can similarly be employed, such as soaking in a solvent bath. As one of ordinary skill in the art will further understand upon reading this disclosure, the first, second, and third patterned photoresist layers 208, 218, and 230 can be removed at earlier or later stages of a fabrication process, as described herein, depending on the number of via and metal levels to be formed. It should be noted that a planarization process such as chemical mechanical polishing (CMP) can be employed after each level of metal deposition, if required, to provide a planar surface for the subsequent processing. The structure is now as appears in FIG. 2E, consisting of a number of mulitlayer metal lines, e.g. 210, 224, and 234, separated by air gaps a above a substrate 200.

Figure 2F:
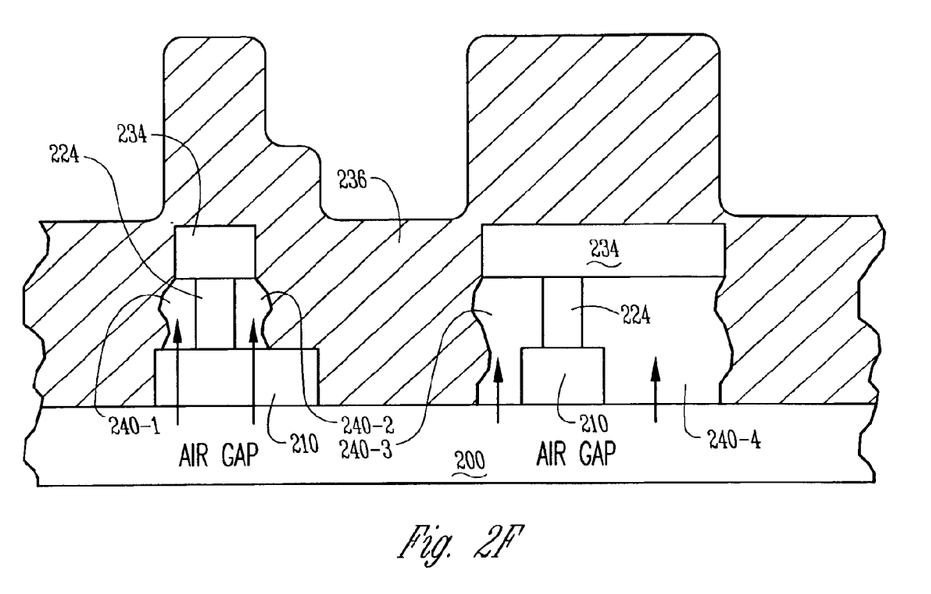

FIG. 2F illustrates the structure following the last and most important step in the fabrication process according to the teachings of the present invention. As shown in FIG. 2F, this step includes the formation of a low dielectric constant material, or low-k dielectric 236 and, at the same time, formation of air gaps 240-1, 240-2, . . . , 240-N. According to the teachings of the present invention, the low-k dielectric 236 is deposited between the number of metal lines, e.g. 210, 224, and 234, and the substrate 200 using a directional process in order to accommodate the concurrent formation of air gaps 240-1, 240-2, . . . , 240-N. In one embodiment, depositing a low dielectric constant material 236 and concurrently forming air gaps 240-1, 240-2, . . . , 240-N includes depositing a low dielectric constant material 236 having a dielectric constant (k) of less than 2.7. According to one embodiment of the present invention, a highly directional process is used to deposit a low-k polymer film 236. In the embodiment shown in FIG. 2F, the area under the multilayer metal lines, 210, 224, and 234, will become air gaps 240-1, 240-2, . . . , 240-N. In one embodiment, depositing a low dielectric constant material 236 between the number of metal lines 210, 224, and 234 and the substrate 200 includes using a highly directional deposition tool. In this embodiment, using a direction process includes using a microwave plasma-assisted supersonic jet deposition technique. An example of this technique for use in the present invention is described in U.S. Pat. No. 5,356,672, issued Oct. 18, 1994 to Schmitt et al., entitled "Method for microwave plasma assisted supersonic jet deposition of thin films". As one of ordinary skill in the art will understand upon reading this disclosure, the ordinary chemical vapor deposition (CVD) process may not be suitable for the present invention, since the conventional CVD process typically provides conformal deposition, which will not form the air gaps 240-1, 240-2, . . . , 240-N according to the teachings of the present invention.

The following descriptions illustrate, by way of example and not by way of limitation, that according to the teachings of the present invention, several polymer source materials can be used. In one embodiment, depositing a low dielectric constant material 236 includes depositing an organic silica film 236. In one example depositing a low dielectric constant material includes the deposition of an extremely low dielectric constant organic silica films 236 such as described in an article by Y. Uchida et al., entitled "A fluorinated Organic-Silica Film with Extremely Low Dielectric Constant," *Japan J. Appl. Phys.*, 38, no. 4B, p. 2368–2372 (1999). The same is incorporated herein by reference. This embodiment includes depositing a fluorinated organic-silica film 236 using a quasi hydrogen-free chemical vapor deposition process. In one embodiment, using a quasi hydrogen-free chemical vapor deposition process includes using a mixture of tetra-iso-cyanate silane, di-methyl silyl di-iso-cyanate silane, and tri-methyl amine by successive fluorination. In one embodiment, using a mixture of tetra-iso-cyanate silane, di-methyl silyl di-iso-cyanate silane, and tri-methyl amine by successive fluorination includes creating a film 236 in which a set of methyl groups and a flouring group of atoms are as much as 43% and 9% respectively of that for a content of silicon atoms in the film 236. Such a film 236 has good insulting characteristics and a dielectric constant (k) as low as 2.5. In one embodiment, the method further includes vacuum annealing this film 236. Vacuum annealing can improve the dielectric constant of this film to approximately k=2.1.

In another embodiment, according to the teachings of the present invention, depositing a low dielectric constant material 236 includes forming a low dielectric constant film by radio frequency plasma enhanced chemical vapor deposition using tetramethylsilane. One embodiment for performing the same is described in an article by A. Grill and V. Patel, entitled "Low dielectric constant films prepared by plasma-enhanced chemical vapor deposition from tetramethylsilane," *Journal of Applied Physics*, 85, no. 6, p. 3314–3318 (1999) which is incorporated herein by reference. In this embodiment, dielectric constants (k) as low as 3.1 can be obtained in annealed films.

In another embodiment, according to the teachings of the present invention, depositing a low dielectric constant material 236 includes forming a polymer-like organic thin film 236 between the number of metal lines, e.g. 210, 224, and 234, and the substrate 200 using a plasma enhanced CVD process using a para-xylene precursor. One embodiment for performing the same is described in an article by Y. C. Quan et al., entitled "Polymer-like Organic thin films Deposited by Plasma Enhanced Chemical Vapor Deposition Using the Para-xylene Precursor as Low dielectric constant Interlayer Dielectrics for Multilevel Metallization," *Japan J. Appl. Phys.*, 38, no. 3A, p. 1356–1358 (1999) which is incorporated herein by reference. According to this embodiment, as the plasma power is increased from 5 Watts (W) to 60 W, the relative dielectric constant (k) of this polymer-like organic thin film 236 increased from 2.7 to 3.21. However, the film 236 deposited at a higher plasma power showed higher thermal stability. The film 236 deposited at 60 W was stable up to 450° C., and all films 236 were insulating under an applied electric field up to as large as 1 MegaVolts/cm.

Again, as one of ordinary skill in the art will understand upon reading this disclosure, any one or combination of the above described methods are suitable for performing the methods of the present invention to create the novel multilevel wiring interconnect such that the structure includes a low dielectric constant material 236 and a number of air gaps 240-1, 240-2, . . . , 240-N formed between the number of metal lines, e.g. 210, 224, and 234, and the substrate 200. The same are not intended to limit the scope of the present invention. One of ordinary skill in the art will further understand upon reading this disclosure, that prior to the directional deposition of the low-k dielectric 236 the number of metal lines, e.g. 210, 224, and 234, can be exposed to a dilute silane at approximately 300 degrees Celsius to form a surface silicide as a passivation layer in order to prevent reaction of a copper metal line, e.g. 210, 224, and 234, and polymer film 236. One method for forming the same is described in an article by S. Hymes et al., entitled "Passivation of Copper by Silicide Formation in Dilute Silane," *MRS Conference Proceedings*, ULSI-VII, p. 425–431 (1992) which is incorporated herein by reference. Another method is described in a co-pending, co-filed and commonly assigned application; attorney docket number 303.685US1, entitled "Multilevel Copper Interconnect with Double Insulation," which is incorporated by reference. One of ordinary skill in the art will understand upon reading this disclosure, that the choice of such a passivation layer is dependant in part upon the dielectric materials 236 used.

Any excess material on top of multilevel wiring interconnect of the present invention can be removed by etching, such as by chemical mechanical polishing (CMP) in order to provide a planarized, smooth surface for subsequent processing. As one of ordinary skill in the art will understand upon reading this disclosure, forming additional or subsequent layer/levels of conductive vias and metallization lines are also included within the scope of the present invention.

Figure 3:
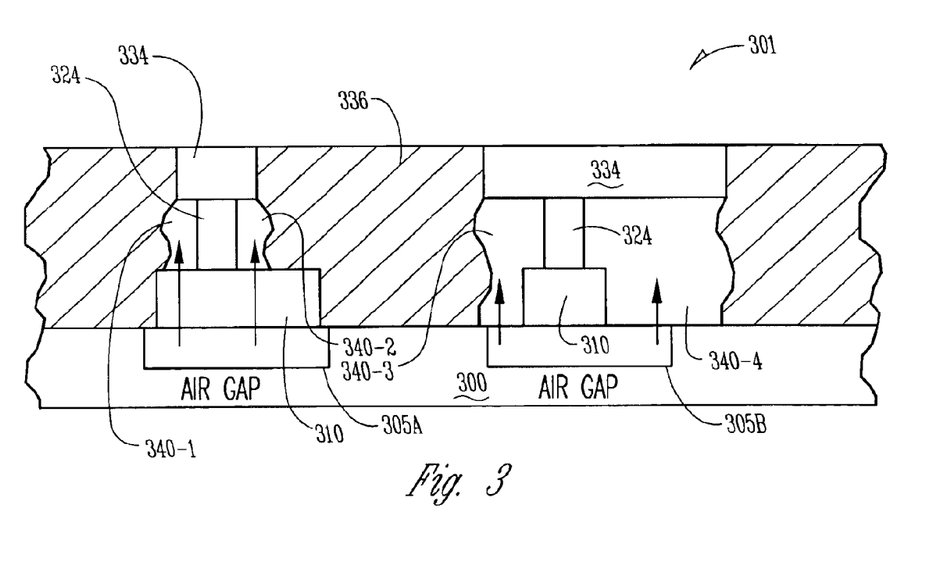
FIG. 3 is an illustration of an integrated circuit formed according to the teachings of the present invention.

FIG. 3 is an illustration of an integrated circuit 301 formed according to the teachings of the present invention. In one embodiment, integrated circuit 301 is part of an integrated memory circuit. As shown in FIG. 3, the integrated circuit 301 includes a multilevel wiring interconnect having a number of multilayer metal lines, e.g. 310, 324, and 334, connecting to a number of semiconductor devices, e.g. one or more transistors 305A and 305B, in a substrate 300. In one embodiment, the number of multilayer metal lines, e.g. 310, 324, and 334, in integrated circuit 301 includes a multilayer copper wiring structure. As shown in FIG. 3, the integrated circuit 301 includes a low dielectric constant insulator 336 in a number of interstices between the number of copper lines, 310, 324, and 334, and the substrate 300. Also, according to the teaching of the present invention, the integrated circuit includes a number of air gaps 340-1, 340-2, . . . , 340-N in the low dielectric constant insulator 336. The embodiment shown in FIG. 3, illustrates that a multilayer wiring interconnect which has been planarized, such as by a CMP process, to provide a planarized, smooth surface for subsequent processing.

Figure 4:
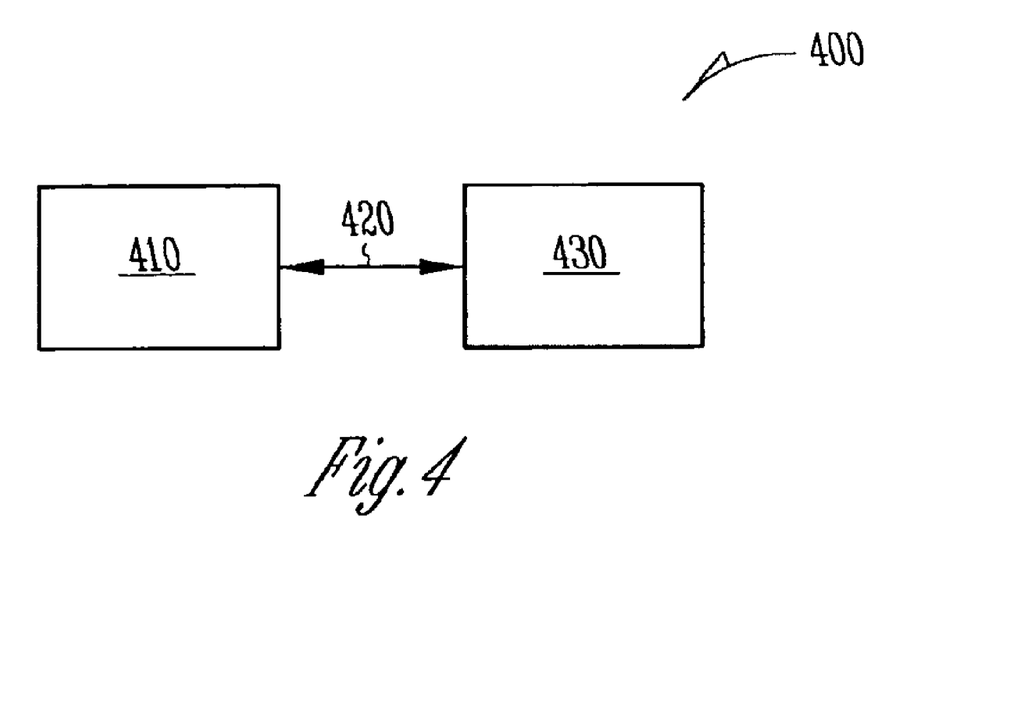
FIG. 4 illustrates a system having an integrated memory circuit and incorporating a multilevel wiring structure formed according to the teachings of the present invention.

FIG. 4 illustrates a system 400 having an integrated memory circuit 430 and incorporating a multilevel wiring structure formed according to the teachings of the present invention. As one of ordinary skill in the art will understand upon reading this disclosure, this system 400 includes a processor 410 and an integrated circuit, or integrated memory circuit 430 coupled to the processor 410. The processor 410 can be coupled to the integrated memory circuit 430 via any suitable bus 420, as the same are known and understood by one of ordinary skill in the art. In the embodiment, the processor 410 and integrated circuit 430 are located on a single wafer or die. Again, at least a portion of the integrated circuit 430 includes a multilevel wiring structure as disclosed in the various embodiments provided herein.

CONCLUSION

Thus, structures and methods have been shown which provide for a multilayer copper wiring structure by electroless, selectively deposited copper in a streamlined process which further reduces both intra-level line to line capacitance and the inter-level capacitance.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit, comprising:
   at least one semiconductor device formed in a substrate;
   a number of multilayer metal lines connecting to a number of silicon devices in the substrate;
   a low dielectric constant, fluorinated silica containing insulator in a number of interstices between the number of multilayer metal lines and the substrate;
   wherein the low dielectric constant insulator includes a number of air gaps in the low dielectric constant material in the number of interstices; and
   wherein the air gaps are disposed between the low dielectric constant material and sidewalls of at least some of the multilayer metal lines.

2. The integrated circuit of claim 1, wherein the low dielectric constant insulator includes a low dielectric constant organic silica film.

3. The integrated circuit of claim 1, wherein the number of multilayer metal lines includes a number of multilayer metal lines selected from the group consisting of Aluminum, Copper, Silver, and Gold.

4. The integrated circuit of claim 1, wherein the number of multilayer metal lines includes a first conductor bridge level.

5. The integrated circuit of claim 1, wherein a first of the number of air gaps is directly beneath a first layer of the number of multilayer metal lines and enclosed by the low dielectric constant, fluorinated insulator.

6. An integrated circuit, comprising:
   at least one semiconductor device formed in a substrate;
   a number of multilayer metal lines connecting to a number of silicon devices in the substrate;
   a low dielectric constant, fluorinated silica containing insulator in a number of interstices between the number of multilayer metal lines and the substrate;
   wherein the low dielectric constant insulator includes a number of air gaps in the low dielectric constant material;
   wherein the low dielectric constant insulator includes a low dielectric constant insulator having a dielectric constant of less than 2.7; and
   wherein the air gaps are disposed between the low dielectric constant material and sidewalls of at least some of the multilayer metal lines.

7. The integrated circuit of claim 6, wherein the low dielectric constant insulator includes a low dielectric constant organic silica film.

8. The integrated circuit of claim 6, wherein the number of multilayer metal lines includes a number of multilayer metal lines selected from the group consisting of Aluminum, Copper, Silver, and Gold.

9. The integrated circuit of claim 6, wherein the number of multilayer metal lines includes a first conductor bridge level.

10. An integrated circuit, comprising:
    at least one semiconductor device formed in a substrate;
    a number of multilayer metal lines connecting to a number of silicon devices in the substrate;
    a low dielectric constant insulator in a number of interstices between the number of multilayer metal lines and the substrate;
    wherein the low dielectric constant insulator includes a number of air gaps in the low dielectric constant material; and
    wherein the low dielectric constant insulator includes a film in which of a set of methyl groups and a fluorine group of atoms are as much as 43% and 9% respectively of that for a content of silicon atoms in the film.

11. The integrated circuit of claim 10, wherein the low dielectric constant insulator includes a low dielectric constant organic silica film.

12. The integrated circuit of claim 10, wherein the number of multilayer metal lines includes a number of multilayer metal lines selected from the group consisting of Aluminum, Copper, Silver, and Gold.

13. The integrated circuit of claim 10, wherein the number of multilayer metal lines includes a first conductor bridge level.

14. An integrated circuit, comprising:
    a substrate including one or more transistors;
    a number of multilayer Copper lines connecting to one or more of the transistors in the substrate;
    a low dielectric constant, fluorinated silica containing insulator in a number of interstices between the number of multilayer Copper lines and the substrate;
    wherein the low dielectric constant insulator includes a number of air gaps in the low dielectric constant material in the number of interstices; and
    wherein the air gaps are disposed between the low dielectric constant material and sidewalls of at least some of the multilayer metal lines.

15. The integrated circuit of claim 14, wherein the low dielectric constant insulator includes a low dielectric constant organic silica film.

16. An integrated circuit, comprising:
    a substrate including one or more transistors;
    a number of multilayer Copper lines connecting to one or more of the transistors in the substrate, wherein the number of multilayer Copper lines includes an interlayer connection;
    a low dielectric constant insulator in a number of interstices between the number of multilayer Copper lines and the substrate;
    wherein the low dielectric constant insulator includes a number of air gaps in the low dielectric constant material;
    wherein the low dielectric constant insulator includes a low dielectric constant insulator having a dielectric constant of less than 2.7;
    wherein the interlayer connection is substantially surrounded by one of the number of air gaps, which is enclosed by the low dielectric constant insulator.

17. The integrated circuit of claim 16, wherein the low dielectric constant insulator includes a low dielectric constant organic silica film.

18. The integrated circuit of claim 16, wherein the number of multilayer metal lines includes a first conductor bridge level.

19. An integrated circuit, comprising:
    a substrate including one or more transistors;

a number of multilayer Copper lines connecting to one or more of the transistors in the substrate;

a low dielectric constant insulator in a number of interstices between the number of multilayer Copper lines and the substrate;

wherein the low dielectric constant insulator includes a number of air gaps in the low dielectric constant material; and wherein the low dielectric constant insulator includes a film in which of a set of methyl groups and a fluorine group of atoms are as much as 43% and 9% respectively of that for a content of silicon atoms in the film.

20. The integrated circuit of claim 19, wherein the low dielectric constant insulator includes a low dielectric constant organic silica film.

21. The integrated circuit of claim 19, wherein the number of multilayer metal lines includes a first conductor bridge level.

22. An integrated circuit, comprising:

at least one semiconductor device formed in a substrate;

a number of multilayer metal lines connecting to a number of silicon devices in the substrate;

a low dielectric constant insulator in a number of interstices between the number of multilayer metal lines and the substrate;

wherein the low dielectric constant insulator includes a number of air gaps in the low dielectric constant material; and wherein the low dielectric constant insulator includes a film in which of a set of methyl groups and a fluorine group of atoms are as much as 43% and 9% respectively of that for a content of silicon atoms in the film and has a dielectric constant of less than 2.7.

23. The integrated circuit of claim 22, wherein the number of air gaps is respectively positioned directly below one of the number of multilayer metal lines.

24. An integrated circuit, comprising:

at least one semiconductor device formed in a substrate;

a first layer above the substrate including a first number of metal lines, wherein one of the first number of metal lines connects to the at least one semiconductor device;

a second layer above the first layer including a second number of metal lines;

an interlayer conductor line connecting the one of the first number of metal lines to one of the second number of metal lines;

a low dielectric constant insulator material in between adjacent first number of metal lines and in between adjacent second number of metal lines;

an air gap in the low dielectric constant material adjacent the interlayer conductor separate the low dielectric constant material from portions of the interlayer conductor and between the one of the first number of metal lines and the one of the second number of metal lines; and wherein the low dielectric constant material encloses the air gap.

25. The integrated circuit of claim 24, wherein the low dielectric constant insulator includes a low dielectric constant insulator having a dielectric constant of less than 2.7.

26. An integrated circuit, comprising:

at least one semiconductor device formed in substrate;

a first layer above the substrate including a first number of metal lines, wherein one of the first number of metal lines connects to the at least one semiconductor device;

a second layer above the first layer including a second number of metal lines;

an interlayer conductor line connecting the one of the first number of metal lines to one of the second number of metal lines;

a low dielectric constant insulator material in between adjacent first number of metal lines and in between adjacent second number of metal lines;

an air gap in the low dielectric constant material adjacent the interlayer conductor and between the one of the first number of metal lines and the one of the second number of metal lines;

wherein the low dielectric constant material encloses the air gap; and wherein the low dielectric constant insulator includes a film in which of a set of methyl groups and a fluorine group of atoms are as much as 43% and 9% respectively of that of a content of silicon atoms in the film.

27. The integrated circuit of claim 26, wherein the interlayer conductor line intersects the air gap and is free of contact with the low dielectric constant material.

* * * * *

UNITED STATES PATENT AND TRADEMARK OFFICE
CERTIFICATE OF CORRECTION

| | |
|---|---|
| PATENT NO. | : 7,091,611 B2 |
| APPLICATION NO. | : 10/093244 |
| DATED | : August 15, 2006 |
| INVENTOR(S) | : Ahn et al. |

It is certified that error appears in the above-identified patent and that said Letters Patent is hereby corrected as shown below:

On the Title page, in item (62), under "Related U.S. Application Data", in column 1, lines 1–2, delete "May 31, 2001" and insert -- May 31, 2000 --, therefor.

On the Title page, in item (56), under "Foreign Patent Documents", in column 2, line 1, after "10/1993" insert -- H01L 029/46 --.

On the Title page, in item (56), under "Other Publications", in column 2, line 5, delete "of" and insert -- Of --, therefor.

On page 2, in item (56), under "U.S. Patent Documents", in column 1, line 16, below "4,423,547 A" insert -- 4,561,173 12/1958 Te Velde 438/619 --.

On page 2, in item (56), under "U.S. Patent Documents", in column 1, line 53, delete "127/446" and insert -- 427/446 --, therefor.

On page 3, in item (56), under "U.S. Patent Documents", in column 1, line 10, after "6,059,553 A" insert -- * --.

On page 3, in item (56), under "U.S. Patent Documents", in column 1, line 48, delete "138/653" and insert -- 438/653 --, therefor.

On page 3, in item (56), under "Other Publications", in column 2, line 39, delete "abstract" and insert -- Abstract --, therefor.

On page 3, in item (56), under "Other Publications", in column 2, line 39, delete "pag." and insert -- page. --, therefor.

On page 4, in item (56), under "Other Publications", in column 2, line 11, delete "1999:" and Insert -- 1999. --, therefor.

On page 4, in item (56), under "Other Publications", in column 2, line 11, after "Digest" insert -- . --.

On page 4, in item (56), under "Other Publications", in column 2, line 28, delete "A." and insert -- A, --, therefor.

On page 4, in item (56), under "Other Publications", in column 2, line 41, delete "Proc." and insert -- Proc, --, therefor.

On page 5, in item (56), under "Other Publications", in column 1, line 11, delete "H.;" and Insert -- H., --, therefor.

UNITED STATES PATENT AND TRADEMARK OFFICE
CERTIFICATE OF CORRECTION

PATENT NO. : 7,091,611 B2
APPLICATION NO. : 10/093244
DATED : August 15, 2006
INVENTOR(S) : Ahn et al.

It is certified that error appears in the above-identified patent and that said Letters Patent is hereby corrected as shown below:

On page 5, in item (56), under "Other Publications", in column 2, line 7, delete "L955-L957" and insert -- L955-957 --, therefor.

Column 1, line 11, after "application;" insert-- attorney docket number 303.672US1, --.

Column 14, line 8, in Claim 24, after "conductor" insert -- to --.

Column 14, line 19, in Claim 26, after "in" insert -- a --.

Column 14, line 40, in Claim 26, after "that" delete "of" and insert -- for --, therefor.

Signed and Sealed this

Twenty-seventh Day of February, 2007

JON W. DUDAS
*Director of the United States Patent and Trademark Office*